US008138705B2

(12) United States Patent
Klemm et al.

(10) Patent No.: US 8,138,705 B2
(45) Date of Patent: Mar. 20, 2012

(54) CIRCUIT ARRANGEMENT AND METHOD FOR CONTROLLING AN ELECTRIC LOAD

(75) Inventors: Torsten Klemm, Bad Soden (DE); Ingo Vetter, Karben (DE)

(73) Assignee: Braun GmbH, Kronberg (DE)

( * ) Notice: Subject to any disclaimer, the term of this patent is extended or adjusted under 35 U.S.C. 154(b) by 636 days.

(21) Appl. No.: 12/306,169

(22) PCT Filed: Jun. 20, 2007

(86) PCT No.: PCT/EP2007/005396
§ 371 (c)(1),
(2), (4) Date: Dec. 22, 2008

(87) PCT Pub. No.: WO2008/000373
PCT Pub. Date: Jan. 3, 2008

(65) Prior Publication Data
US 2009/0179606 A1    Jul. 16, 2009

(30) Foreign Application Priority Data

Jun. 30, 2006 (DE) .......................... 10 2006 030 821

(51) Int. Cl.
*H02P 23/00* (2006.01)
(52) U.S. Cl. .............. 318/509; 318/400.29; 318/400.25; 318/400.26; 318/400.27; 318/400.28
(58) Field of Classification Search .................. 318/509, 318/400.29, 400.25–400.28
See application file for complete search history.

(56) References Cited

U.S. PATENT DOCUMENTS

| 4,379,984 A | * | 4/1983 | Muller ..................... 318/400.29 |
| 6,650,072 B2 | * | 11/2003 | Harlan ...................... 318/400.2 |
| 6,909,252 B2 | * | 6/2005 | Xi ............................ 318/400.29 |
| 7,019,551 B1 | | 3/2006 | Biesterfeldt |

FOREIGN PATENT DOCUMENTS

| DE | 102 06 392 | 9/2003 |
| DE | 102 46 520 | 4/2004 |
| DE | 102 09 164 | 8/2005 |
| DE | 102005059571 | 6/2007 |
| FR | 2 847 354 | 11/2002 |
| WO | WO95/24076 | 9/1995 |

OTHER PUBLICATIONS

"CMOS Delay Controlled Circuit" IBM Technical Disclosure Bulletin, IBM Corp New York Bd. 38, Nr. 3, Mar. 1, 1995, pp. 279-280, XP000508053 ISSN:0018-8689.

\* cited by examiner

*Primary Examiner* — Walter Benson
*Assistant Examiner* — David Luo
(74) *Attorney, Agent, or Firm* — David K Mattheis; Kim W Zerby

(57) ABSTRACT

A circuit arrangement for controlling an electrical load is provided with a bridge circuit which comprises four electronic switches with the load arranged in a transverse leg of the bridge circuit. A control circuit has respective control terminals for the four electronic switches. The control terminal for the first electronic switch is connected to the control terminal for the fourth electronic switch by means of a series connection consisting of a first capacitor and a first resistance, and the control terminal for the third electronic switch is connected to the control terminal for the second electronic switch by means of a series connection consisting of a second capacitor and a second resistance.

13 Claims, 1 Drawing Sheet

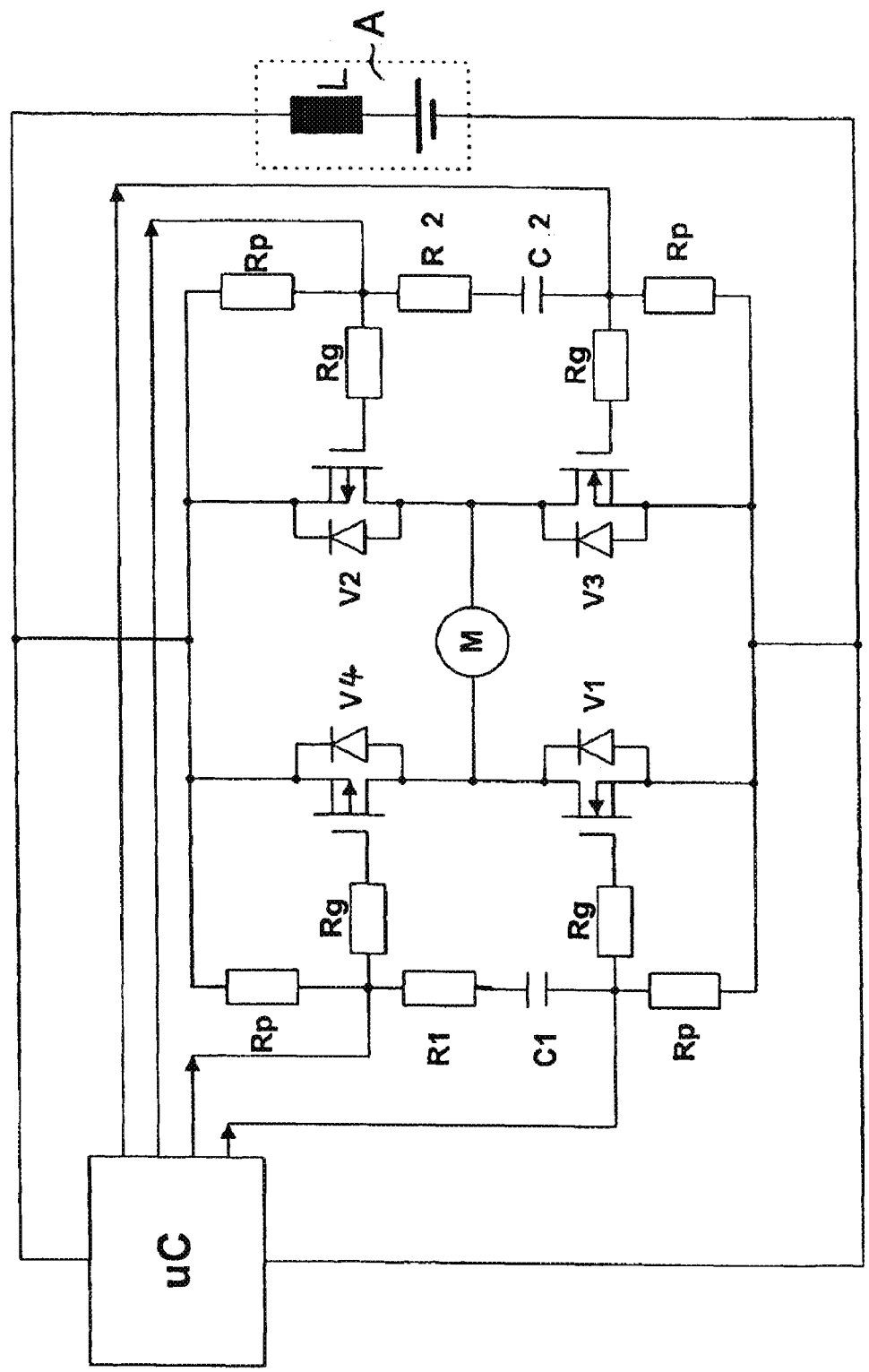

CIRCUIT ARRANGEMENT AND METHOD FOR CONTROLLING AN ELECTRIC LOAD

TECHNICAL FIELD

The invention relates to a circuit arrangement and a method for controlling an electric load, such as by an electronic switch controlled by a control circuit and in a bridge circuit for operating an electric motor of a battery-operated miniature electronic device.

BACKGROUND

A background circuit arrangement is described, for example, in DE 10 2005 059 571. DE 102 46 520 A1 also describes a circuit arrangement and a method for controlling an oscillating electric motor of a battery-operated miniature electric device by means of a bridge circuit. If the miniature electric device is operated with an lithium ion battery, for example, and if the electronic switches of the bridge circuit are controlled by a control circuit with either a "low" level or a "high" level, then in switching the electronic switches, the power supply voltage may drop drastically or may even increase to more than double because a lithium ion battery, in comparison with other batteries, typically has a high parasitic inductance that induces a correspondingly high counter-voltage when there are changes in the electric current.

An object of the present invention is to provide a circuit arrangement and a method for controlling an electric load, which is designed specifically for operation with a voltage source having a high parasitic inductance.

SUMMARY

One aspect of the invention features a circuit arrangement comprising at least one electronic switch and one control circuit that switches the electronic switch from the non-conducting state to the conducting state or vice versa, so that changes in the current flowing are relatively minor over time. In this way, the relatively high parasitic inductance of a lithium ion battery used for the power supply cannot generate an excessively high counter-voltage, so that, for example, a microcontroller used as the control circuit can be supplied with electric current directly by the battery. In this manner, it may not be necessary to have capacitors to smooth the battery voltage. This circuit arrangement is preferably intended for electric toothbrushes or electric shavers, which have an oscillating electric motor or a linear motor as the drive and are operated with a lithium ion battery.

Great changes in electric current over time may lead to an unwanted high counter-voltage not only because of the relatively high parasitic inductance of a lithium-ion battery used for the power supply but naturally also because of the inductance of the electronic load controlled by the circuit arrangement. If the load is an inductive load, then the method described herein is used at least when deactivating the electric current flowing through the load.

In a method for controlling an electric load, the control circuit switches the electronic switch(es) from the conducting state to the non-conducting state and/or vice versa in at least two steps. For example, the voltage level at the control terminal of the control circuit and/or at the control terminal of the electronic switch is switched from "low" to "high" via "open" and/or from "high" to "low" via "open." The method can preferably be implemented in a control circuit in CMOS technology by the fact that the control terminal of the control circuit can be switched ("tristate") either as input ("high impedance") or as output ("low" or "high"), and for switching the electronic switch from the conducting state to the non-conducting state and/or vice versa, the control terminal of the electric switch is switched from "low" to "high" via "high impedance" and/or from "high" to "low" via "high impedance." The control circuit preferably performs the second step, switching from "high impedance" to "high" or "low," only after the electronic switch has altered its state ("conducting" or "non-conducting").

With a circuit in which the control circuit controls the electric load by means of four electronic switches in a bridge circuit, and the load is arranged in a transverse branch of the bridge circuit, the control circuit has control terminals for the four electronic switches. The control terminal for the first electronic switch is connected to the control terminal for the fourth electronic switch via a series connection of a first capacitor and a first resistor, and the control terminal for the third electronic switch is connected to the control terminal for the second electronic switch via a series connection of a second capacitor and a second resistor. The first and fourth electronic switches are connected to one end of the electric load, and the second and third electronic switches are connected to the other end of the electric load.

The invention is explained in greater detail below on the basis of an exemplary embodiment for a circuit arrangement for controlling an electric consumer, which is depicted in the only drawing. Additional embodiments are described in the description.

BRIEF DESCRIPTION OF DRAWINGS

FIG. 1 is an electrical schematic of a circuit according to one embodiment of the invention.

DETAILED DESCRIPTION

The circuit arrangement shown in the FIGURE contains a battery A, which has a parasitic inductance L. Furthermore, a bridge circuit having four transistors V1, V2, V3, V4 is provided, an electric motor M or another electric load being arranged its transverse branch. The four transistors V1, V2, V3, V4 are MOS-FETs, each of which includes a protection diode. They may be controlled by a control circuit uC, which therefore has four control terminals, each of which may assume the states "high impedance" (input) or "low" or "high" (output) ("tristate"). The control circuit uC is supplied with electric current directly from the battery A. The first transistor V1 and the third transistor V3 are n-channel MOS-FETs, whose source terminals are connected to the negative pole of the battery A. The second transistor V2 and the fourth transistor V4 are p-channel MOS-FETs, whose source terminals are connected to the positive pole of the battery A. The drain terminals of the first MOS-FET V1 and the fourth MOS-FET V4 are connected to one end of motor M, and the drain terminals of the second MOS-FET V2 and the third MOS-FET V3 are connected to the other end of motor M. The gate terminals of the four transistors V1, V2, V3, V4 are each connected to one of the four control terminals of the control circuit uC across a gate resistor Rg. The gate resistors Rg serve to limit the total current flowing into the control unit when the transistors are controlled. They may also be omitted if the control circuit is designed for higher currents. The source terminals of each transistor are each connected to the gate terminals of the respective transistor via a pull-up/pull-down resistor Rp and the respective gate resistor Rg. The control terminal for the first transistor V1 is connected to the control terminal for the fourth transistor V4 via a series connection of a first resistor R1 and a first capacitor C1. The control terminal for the third transistor V3 is connected to the control terminal for the second transistor V2 via a series connection of a second resistor R2 and a second capacitor C2.

The functioning of the circuit arrangement shown in the FIGURE is described below. In the starting situation, which is considered first, the circuit arrangement is in a state in which a "low" potential prevails at the control terminals for the fourth transistor V4 and the first transistor V1, and a "high" potential prevails at the control terminals for the second transistor V2 and the third transistor V3. Thus, the fourth transistor V4 and the third transistor V3 are switched through in this state, whereas the first transistor V1 and the second transistor V2 are blocked, so that current flows from the battery A across the fourth transistor V4 and the third transistor V3 to the motor M. The circuit arrangement is then switched to the state in which the current flows through the motor M in the opposite direction, i.e., from the battery A across the second transistor V2 and the first transistor V1. This switching, i.e., deactivation of the current flowing at the moment and then activation of a current in the opposite direction, is explained below.

In the starting situation defined above, a "low" potential prevails at the control terminals for the fourth transistor V4 and the first transistor V1, so that the first capacitor C1 is discharged. Disconnection of the current flowing at the moment then begins with the control circuit uC switching the control terminal for the fourth transistor V4 from "low" to "high impedance" at a point in time T1, so that the voltage at the gate of the fourth transistor V4 jumps to a value determined by the Rp/R1 ratio. Therefore, a voltage is then applied to the capacitor C1, causing the latter to be charged. At the same time, the Miller capacitance (parasitic gate-drain capacitance) of the fourth transistor V4 is discharged. Charging of the capacitor C1 produces a further increase in voltage on the gate of the fourth transistor V4 and thus further discharging of the Miller capacitance of the fourth transistor V4. If the gate-source voltage has reached approximately the same value as the drain source voltage at a point in time T2>T1, then the fourth transistor V4 switches to its deactivated state and the Miller capacitance drops to a comparatively low value. The voltage on the gate of the fourth transistor V4 then increases further, but the time constant of this change in voltage is hardly determined by the Miller capacitance of the fourth transistor V4 but instead is determined mainly by the capacitance of the first capacitor C1 and the total Rp+R1. At a point in time T3>T2, the control circuit uC switches the control terminal for the fourth transistor V4 from "high impedance" to "high," so that deactivation of the fourth transistor V4 is terminated. With suitable dimensioning of the first capacitor C1 and the resistors Rp and Rg and a suitable choice of the switching point in time T3 with respect to T1 and/or T2, the result is a soft disconnection of the fourth transistor V4, so that the change in flowing current over time is so minor that the battery voltage is hardly affected by it.

Deactivation of the third transition V3 may take place at a point in time parallel to the deactivation of the fourth transistor V4. However, the third transistor V3 is preferably deactivated only when little or no current is still flowing, i.e., with a time lag from the disconnection of the fourth transistor V4. The third transistor V3 may be deactivated by the same method as that described above on the basis of the fourth transistor V4. However, if little or no current is flowing through the third transistor V3, it may also be deactivated in a "hard" manner in that the control circuit uC switches the respective control terminal directly from "high" to "low" without thereby inducing any mentionable parasitic voltage. The second capacitor C2 is charged due to the deactivation of the third transistor V3.

However, it is especially advantageous if, after the fourth transistor V4 has been turned off, the first transistor V1 is turned on and the third transistor V3 initially remains activated, i.e., the motor M is short-circuited across the first transistor V1 and the third transistor V3, as described in DE 102 46 520 A1. The short-circuit current, which, because of the inductance of the motor M, is still flowing through the motor M even after the fourth transistor V4 has been deactivated, is consumed and cannot flow back to the battery across the protection diodes of the first transistor V1 and the second transistor V2. In this way, the efficiency of the circuit arrangement is improved and this prevents the parasitic inductance of the battery from inducing parasitic voltages. Only when practically no current is flowing through the motor M is the third transistor V3 turned off. Then the second transistor V2 may be activated by the control circuit uC switching the respective control terminal directly from "high" to "low" so that now a current can flow through the motor M in the opposite direction across the first transistor V1 and the second transistor V2, such that because of the inductance of the motor, the change in the current on activation of the second transistor V2 over time is sufficiently low.

In the case when the first transistor V1 and the second transistor V2 are activated only after deactivation of the third transistor V3 and the fourth transistor V4 to allow a current to flow through the motor M in the opposite direction, preferably the first transistor V1 is activated first and then the second transistor V2 is activated; the first transistor V1 may also be activated in a "hard" manner in that the control circuit uC switches the respective control terminal directly from "low" to "high" without inducing any mentionable parasitic voltages. Due to the activation of the first transistor V1, the first capacitor C1 is discharged. Then the second transistor V2 is activated, which may also be accomplished in a "hard" manner when the electric load represents an inductive load. Deactivation of the current flowing through the motor M and the second transistor V2 and the first transistor V1 takes place as described above on the basis of deactivation of the current flowing through the fourth transistor V4 and the third transistor V3.

Thus, the deactivation and optional activation of the electronic switches take place according to the following method: In a first step, the control circuit switches its control terminal, which may be switched ("tristate") either as an input ("high impedance") or as an output ("low" or "high") for controlling the electronic switch, from "low" to "high impedance" and only in a second step does it switch to "high" and/or it switches from "high" to "high impedance" in a first step and then to "low" only in a second step. The interval of time between the first step and the second step is adjusted through suitable dimensioning of the wiring of the electronic circuit to the Miller capacitance of the electronic circuit, said wiring containing at least one resistor and one capacitor, and is preferably set at a fixed value, whereby the wiring is formed by the resistors Rp, Rg, R1, R2 and the first capacitor C1 and the second capacitor C2 in the case of the bridge circuit described above.

What is claimed is:
1. An electric load control circuit comprising:
a bridge circuit having four electronic switches with a load arranged in a transverse branch thereof; and
a controller having a respective control terminal for each of the four electronic switches;

wherein the control terminal for the first electronic switch is connected to the control terminal for the fourth electronic switch via a series connection of a first capacitor and a first resistor, and the control terminal for the third electronic switch is connected to the control terminal for the second electronic switch via a series connection of a second capacitor and a second resistor.

2. The electric load control circuit of claim 1, wherein the electronic switches comprise transistors.

3. The electric load control circuit of claim 2, wherein the transistors comprise MOS power transistors.

4. The electric load control circuit of claim 1, wherein the controller comprises a microcontroller.

5. The electric load control circuit of claim 4, wherein the microcontroller comprises a CMOS microcontroller.

6. The electric load control circuit of claim 1, wherein the control terminals of the controller can each be switched between three states, including a high impedance input state, a low output state and a high output state.

7. The electric load control circuit of claim 1, wherein each control terminal of the controller is connected to a control terminal of a respective one of the electronic switches across a gate resistor.

8. The electric load control circuit of claim 1, wherein each control terminal of the controller is connected to a source terminal of a respective one of the electronic switches across a pull-up and/or pull-down resistor.

9. A miniature electric device comprising a motor and the electric load control circuit of claim 1, with the motor forming the load arranged in the transverse branch of the bridge circuit.

10. A method of controlling an electric load, the method comprising:
providing a bridge circuit having four electronic switches with the electric load arranged in a transverse branch thereof, the bridge circuit connected to a controller having a respective control terminal for each of the four electronic switches, with the control terminal for a first of the electronic switches connected to the control terminal for a fourth of the electronic switches via a series connection of a first capacitor and a first resistor, and the control terminal for a third of the electronic switches connected to the control terminal for a second of the electronic switches via a series connection of a second capacitor and a second resistor; and either
switching one of the control terminals of the controller from a first one of a low output state and a high output state to a high impedance input state, and then
switching said one of the control terminals from the high impedance input state to the other of a high output state and a low output state.

11. The method of claim 10, wherein the controller switches the control terminal from the high impedance state only after switch associated with the control terminal has changed its state.

12. The method of claim 10, wherein an interval of time for which the control terminal remains at the high impedance input state is selected in accordance with the Miller capacitance of the electronic switch.

13. The method of claim 10, comprising switching several of the electronic switches of the bridge circuit.

* * * * *